(12) United States Patent
Mouri

(10) Patent No.: US 6,320,646 B1
(45) Date of Patent: Nov. 20, 2001

(54) EXPOSURE APPARATUS, METHOD OF CONTROLLING SAME, AND DEVICE MANUFACTURING METHOD

(75) Inventor: Takashi Mouri, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/356,698

(22) Filed: Jul. 20, 1999

(30) Foreign Application Priority Data

Jul. 29, 1998 (JP) .................................................. 10-227558

(51) Int. Cl.⁷ ............................. G03B 27/42; G03B 27/32
(52) U.S. Cl. ................................................. 355/53; 355/77
(58) Field of Search ................................. 355/30, 53, 55, 355/67, 77, 74–76; 356/399–400

(56) References Cited

U.S. PATENT DOCUMENTS 5,243,377 * 9/1993 Umatate et al. ........................ 355/53
5,909,030 * 1/1999 Yoshitake et al. ................. 250/492.2
6,002,987 * 12/1999 Kamiya et al. .......................... 702/56

* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

An exposure apparatus exposes a substrate to a pattern on a reticle in accordance with a job transferred to the apparatus proper and by executing predetermined calibration processing. The apparatus has a function which, when a job and a reticle used in exposure of a substrate in a current lot are the same as a job and a reticle that were used in exposure of a substrate in a preceding lot, bypasses re-transfer of a job to the apparatus proper and/or the calibration processing in regard to exposure of the current lot.

9 Claims, 8 Drawing Sheets

EXPOSURE APPARATUS, METHOD OF CONTROLLING SAME, AND DEVICE MANUFACTURING METHOD

BACKGROUND OF THE INVENTION

This invention relates to an exposure apparatus such as a semiconductor manufacturing apparatus for manufacturing semiconductor devices such as LSI and VLSI devices, as well as a device manufacturing method that employs this exposure apparatus.

In order to process separate lots in a semiconductor device manufacturing operation quickly and efficiently, a plurality of semiconductor exposure apparatuses used in a lithographic process are typically placed under the overall control of a host computer or personal computer hierarchically superior to the computer on the side of each exposure apparatus. Ordinarily, a command to start the exposure processing is issued after specific parameters for exposure (a "job") necessary to process a certain lot are selected from a database in which operating parameters have been stored.

Further, in order to raise the availability rate of each exposure apparatus at a semiconductor plant and achieve unmanned operation in a clean room to cope with the automation of semiconductor device manufacture, there is a tendency to place coating and developing equipment used in processes upstream and downstream of each exposure apparatus inline and perform overall control by a host computer or personal computer.

When exposure is carried out, often one carrier (25 wafers) is treated as one lot. If volume of production is low and there are a wide variety of products made, the job used or the reticle used usually differs from one lot to the next. However, in a case where volume of production is high and there are a narrow variety of products made, it is possible that the same job and reticle will be used for two or three lots in succession.

In order to automate the manufacturing operation, raise the availability rate of each exposure apparatus, and perform operations efficiently in these circumstances, the changeover from one lot to another must be executed at the highest speed practicable. The prior art is such that even in a case where two or three successive lots are processed by the same job and reticle, a job selected from a database is transferred to the exposure apparatus proper and calibration processing is always executed from one lot to the next.

In accordance with the aforementioned example of the prior art, however, despite the fact that the same job and reticle are used for two or three lots in succession, re-transfer of the job and re-measurement for calibration are performed from one lot to the next. As a consequence, the real availability rate of the exposure apparatus declines and time is wasted at the changeover between lots.

SUMMARY OF THE INVENTION

Accordingly, an object of the present invention is to provide an exposure apparatus and a device manufacturing method that employs this apparatus, in which when lots using the same job and reticle are processed in succession, the time needed for changeover between lots is shortened by eliminating time that is wasted as the changeover between lots, thereby improving real availability rate of the exposure apparatus.

According to the present invention, the foregoing object is attained by providing an exposure apparatus for executing predetermined calibration processing and exposing a substrate to a pattern on a reticle in accordance with a job transferred to the apparatus and representing exposure parameters for one lot. The apparatus comprises a determining means and a by-pass means. The determination means determines whether a job and a reticle used to expose a current lot are the same as a job and a reticle used to expose a preceding lot. The bypass means bypasses re-transfer of a job to the apparatus and/or the calibration processing when the determination means determines that a job and a reticle used to expose the current lot and a job and a reticle used to expose the preceding lot are the same.

In accordance with the present invention, re-transfer of a job and/or calibration processing is bypassed in a case where lots using the same job and the same reticle are processed in succession. Unnecessary processing is eliminated and time is not wasted at the changeover from the preceding lot to the current lot. As a result, when lots using the same job and the same reticle are processing successively, changeover time between lots is shortened and real availability rate of the exposure apparatus is raised. In a case where re-transfer of a job or calibration processing is bypassed, the job or the calibration value used in the preceding lot is maintained in the processing of the current lot.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

In a preferred embodiment of the present invention, when the time from the conclusion of the exposure processing of the preceding lot to the start of exposure processing of the current lot exceeds a predetermined time interval, the calibration processing is executed before the exposure of the current lot or substrate is performed, even if the preceding job and reticle are identical to the current job and reticle. This prevents a decline in exposure precision.

By way of example, tilt-pattern offset measurement and focus-pattern offset measurement are included as calibration processing. When calibration processing is performed before the exposure processing of the current lot, calibration processing is performed using the first substrate of the current lot.

An arrangement may be adopted in which a decision as to whether job re-transfer and/or calibration is to be bypassed is made upon taking into consideration an indication from the console of the apparatus, a host computer or a personal computer. More specifically, an arrangement may be adopted in which the actual judgment is rendered by a host computer and the like, the exposure apparatus decides whether to effect the bypass in accordance with the judgment rendered.

Figure 1:
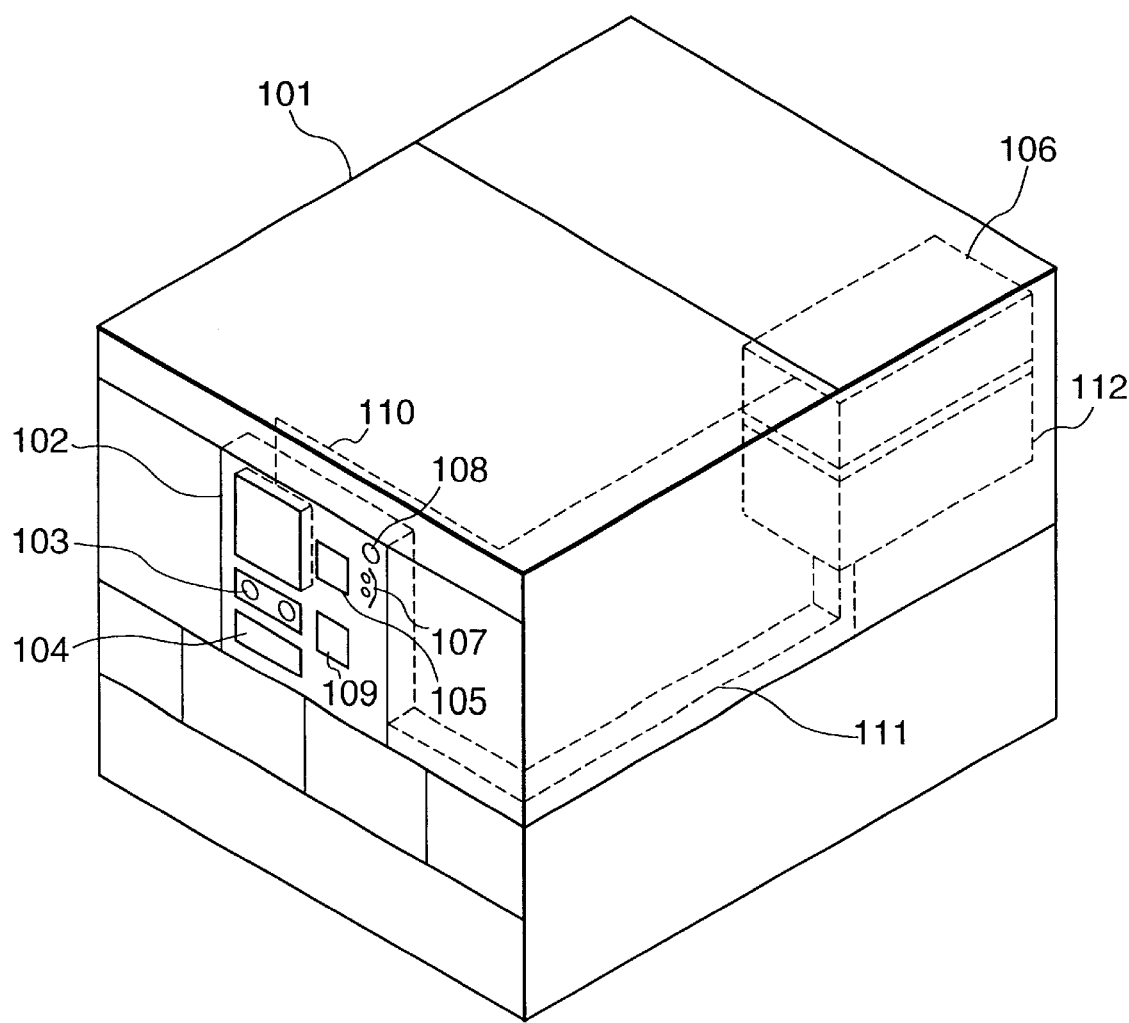
FIG. 1 is a perspective view showing the appearance of a semiconductor exposure apparatus according to an embodiment of the present invention.

FIG. 1 is a perspective view showing the appearance of a semiconductor exposure apparatus according to an embodiment of the present invention. As shown in FIG. 1, the semiconductor exposure apparatus includes an EWS (Engineering Workstation) 106 having a CPU which executes control of the apparatus, and a console having an EWS display 102 for displaying prescribed information relating to the apparatus, a monitor TV 105 for displaying image information obtained via image sensing means of the apparatus proper, a control panel 103 for making prescribed inputs to the apparatus, and an EWS keyboard 104, etc. Also shown in FIG. 1 are an ON/OFF switch 107, an emergency stop switch 108, various switches 109 and a mouse, a LAN communication cable 110, an exhaust duct 111 for heat produced by the console functions, and an exhaust device 112 for a chamber 101. The semiconductor exposure apparatus proper is placed inside the chamber 101.

The EWS display 102, which is a flat-panel display such as an electroluminescent display, plasma display or liquid crystal display, is provided on the front side of the chamber 101 and connected to the EWS 106 via the LAN communication cable 110. The control panel 103, keyboard 104 and monitor TV 105 are disposed on the front side of the chamber 101. Thus, console operation similar to that of the prior art can be performed from the front side of the chamber 101.

Figure 2:
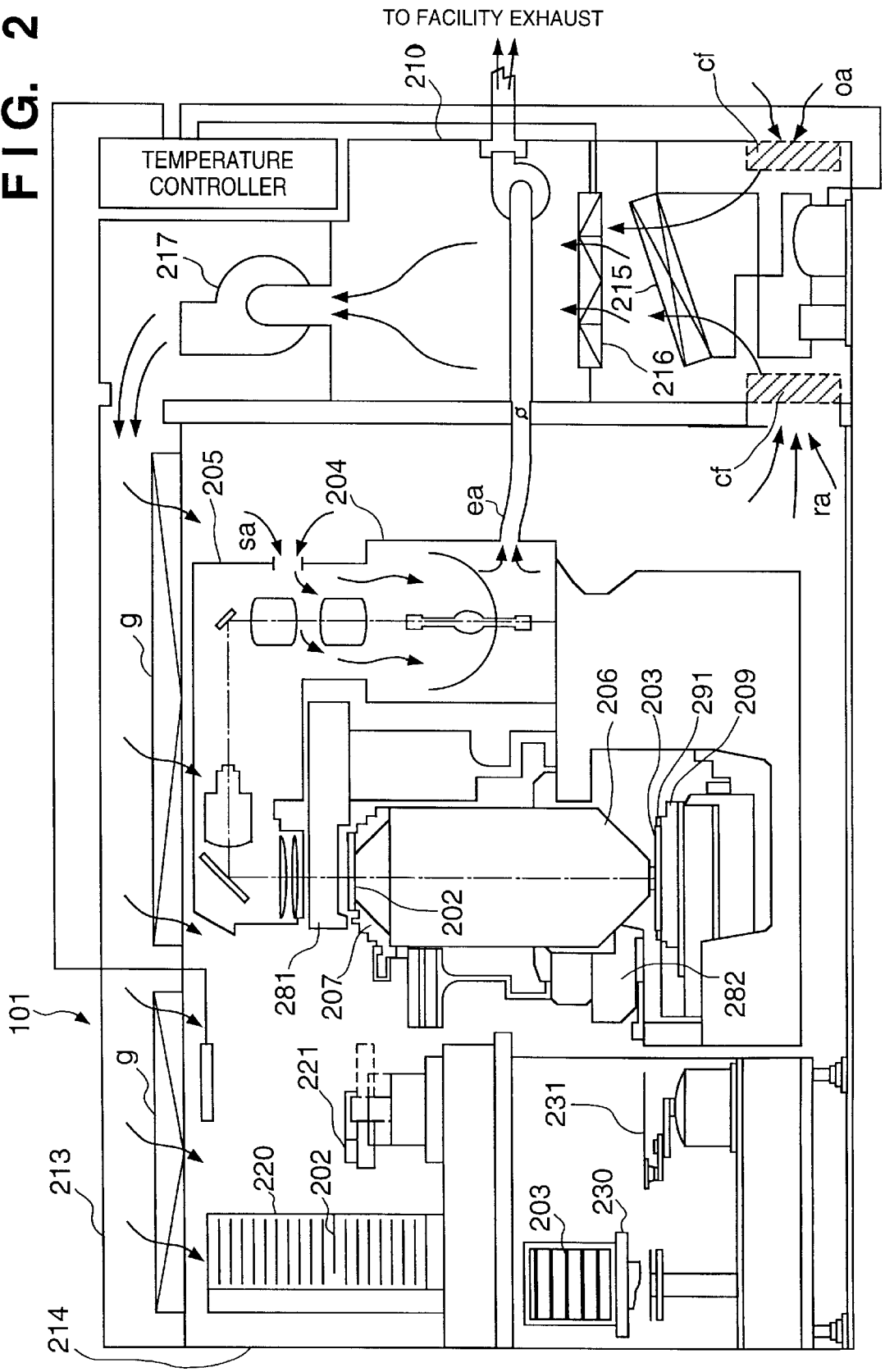
FIG. 2 is a diagram showing the internal structure of the apparatus shown in FIG. 1.

FIG. 2 is a diagram showing the internal structure of the apparatus depicted in FIG. 1. A stepper serving as the semiconductor exposure apparatus is illustrated in FIG. 2. Numerals 202 and 203 denote a reticle and a wafer, respectively. When a light beam emitted by an exposure apparatus 204 illuminates the reticle 202 through an illumination optical system 205, the pattern on the reticle 202 can be transferred to a photosensitive layer on the wafer 203 by a projection lens 206. The reticle 202 is supported by a reticle stage 207 for holding and moving the reticle 202. The wafer 203 is exposed while being held under suction by a wafer chuck 291. The latter is capable of being moved along coordinate axes by a wafer stage 209. Disposed above the reticle 202 is a reticle optical system 281 for detecting the amount of positional deviation of the reticle. Disposed above the wafer stage 209 is an off-axis microscope 282 alongside the projection lens 206. The main function of the off-axis microscope 282 is to detect the relative positions of an internal reference mark and an alignment mark, which is provided on the wafer 203. A reticle library 220 and a wafer calibrator 230, which are items of peripheral equipment, are disposed adjacent the steppers proper. The recticles and wafers required are transported to the main body of the apparatus by a reticle transport unit 221 and a wafer transport unit 231. It should be noted that when a reticle is transported to a reticle library 220 or to the main body by the reticle transport unit 221, a bar code on a reticle cassette is read in by a reticle-cassette bar-code reader 222.

The chamber 101 is constituted by an air conditioning device 210 mainly for regulating the temperature of the air, a filter box 213 for filtering out minute foreign matter and forming a uniform flow of cleansed air, and a booth 214 for shielding the environment of the apparatus from the outside. The air whose temperature has been regulated in the chamber 101 by a cooler 215 and reheater 216 located in the air conditioning device 210 is supplied to the interior of the booth 214 by a blower 217 via an air filter g. The air that has been supplied to the booth 214 is accepted by the air conditioning device 210 from a return port ra and circulates through the interior of the chamber 101. The chamber 101 usually is not a full circulating system, strictly speaking. In order to maintain the interior of the booth 214 at positive pressure at all times, air outside the booth 214 amounting to about ten percent of the amount of circulating air is introduced via a blower from an outside-air inlet oa provided in the air conditioning device 210. The chamber 101 thus makes it possible to hold constant the temperature of the environment in which the apparatus is placed and to keep the air clean. A light source 204 is provided with an intake port sa and an exhaust port ea to cool a superhigh-pressure mercury-arc lamp and to prepare for the evolution of toxic gas when a laser malfunctions. Some of the air in the booth 214 passes through the light source 204 and is forcibly exhausted from the plant facility via a special-purpose exhaust fan provided in the air conditioning device 210. Chemical adsorption filters cf for removing chemical substances from the air are provided by being connected to respective ones of the outside-air inlet oa and return port ra of the air conditioning device 210.

Figure 3:
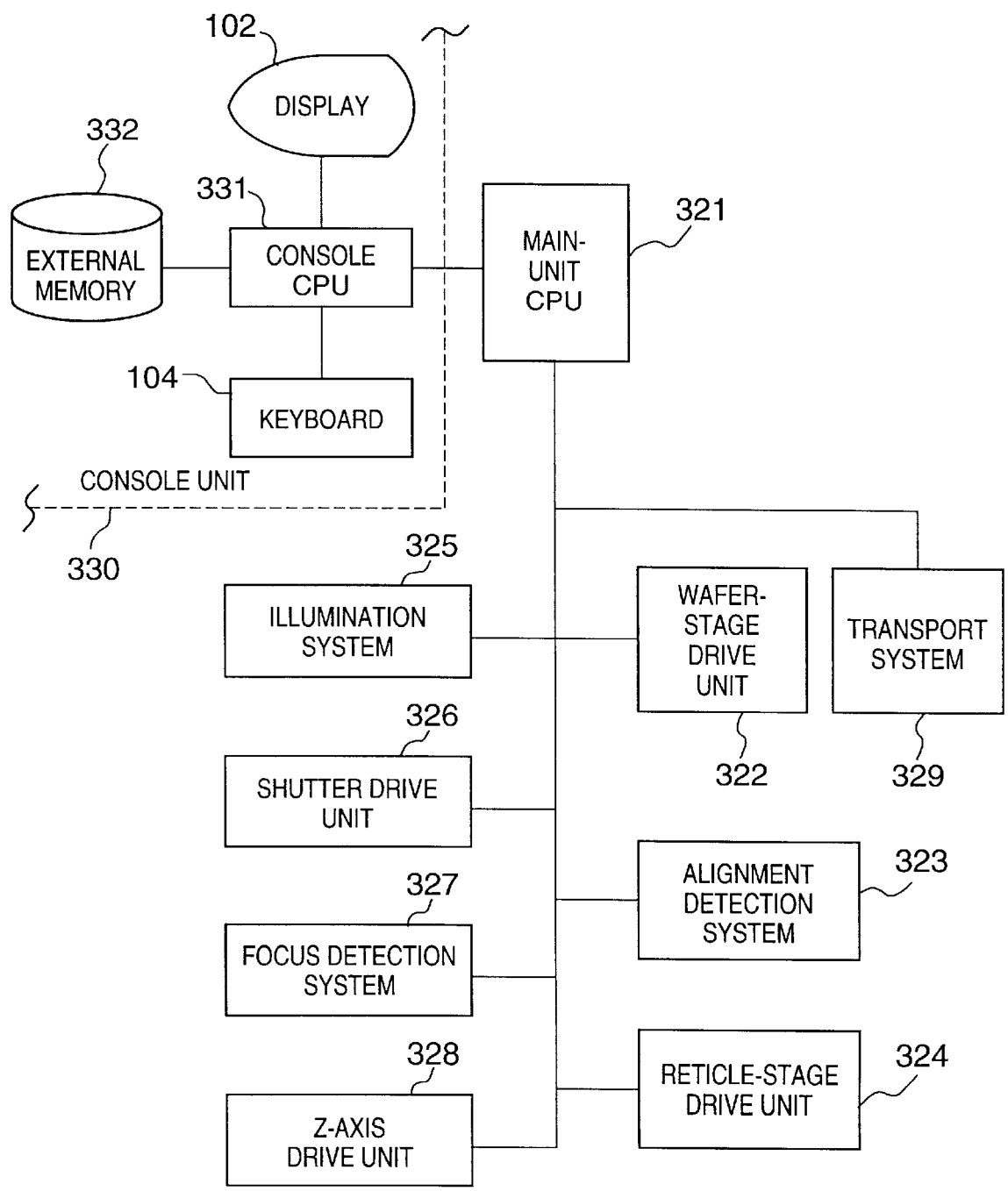
FIG. 3 is a block diagram showing the electrical circuitry constituting the apparatus of FIG. 1.

FIG. 3 is a block diagram illustrating the electrical circuitry of the apparatus shown in FIG. 1. A main-unit CPU 321 for supervising overall control of the apparatus is built in the EWS 106 and is constituted by a central processing unit of a microcomputer or minicomputer, etc. Also shown in FIG. 3 are a wafer-stage drive unit 322, an alignment detection system 323 such as the off-axis microscope 282, a reticle-stage drive unit 324, an illumination system 325 such as the light source 204, a shutter drive unit 326, a focus detection system 327 and a Z-axis drive unit 328. These components are controlled by the main-unit CPU 321. The circuitry further includes a transport system 329 such as the reticle transport unit 221 and wafer transport unit 231, and a console unit 330 having the display 102 and keyboard 104, etc. The console unit 330 is for providing the main-unit CPU 321 with various commands and parameters relating to operation of this exposure apparatus. More specifically, the console unit 330 allows information to be exchanged with the operator. The console unit 330 has a console CPU 331 and an external memory 332 for storing parameters and the like.

Figure 4:
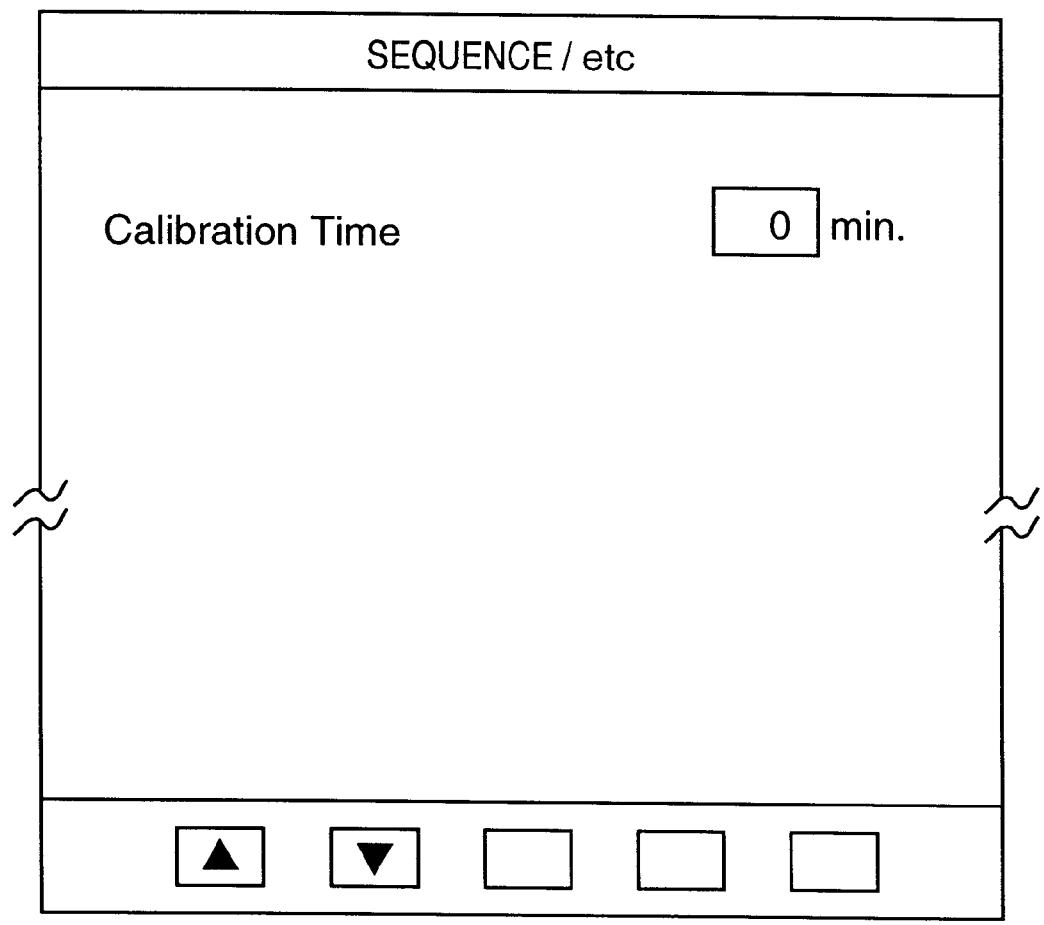
FIG. 4 is a diagram showing an example of a screen for setting user set-up parameters in the apparatus of FIG. 1.

FIG. 4 shows a screen for setting user set-up parameters. When the user selects the user set-up parameter setting screen by the input means (the control panel 103, the keyboard 104 and a mouse, not shown) of the apparatus, the screen (window) depicted in FIG. 4 is displayed on the display (and touch panel) 102. Although a number of other parameters are actually displayed on the screen of FIG. 4, only the parameters relating to the present invention are shown in FIG. 4. Even in the case of successive lots using the same job and reticle, it is necessary to perform calibration if the time between lots exceeds a fixed time. "Calibration Time" shown in FIG. 4 is a parameter used to make this decision. This parameter is employed also in judging the time between wafers within a lot. More specifically, the time set by "Calibration Time" is a length of time that elapses between lots or between wafers before it becomes necessary to perform a calibration. If the set time is made "0", this means that monitoring of time between lots or between wafers is not carried out.

Figure 5:
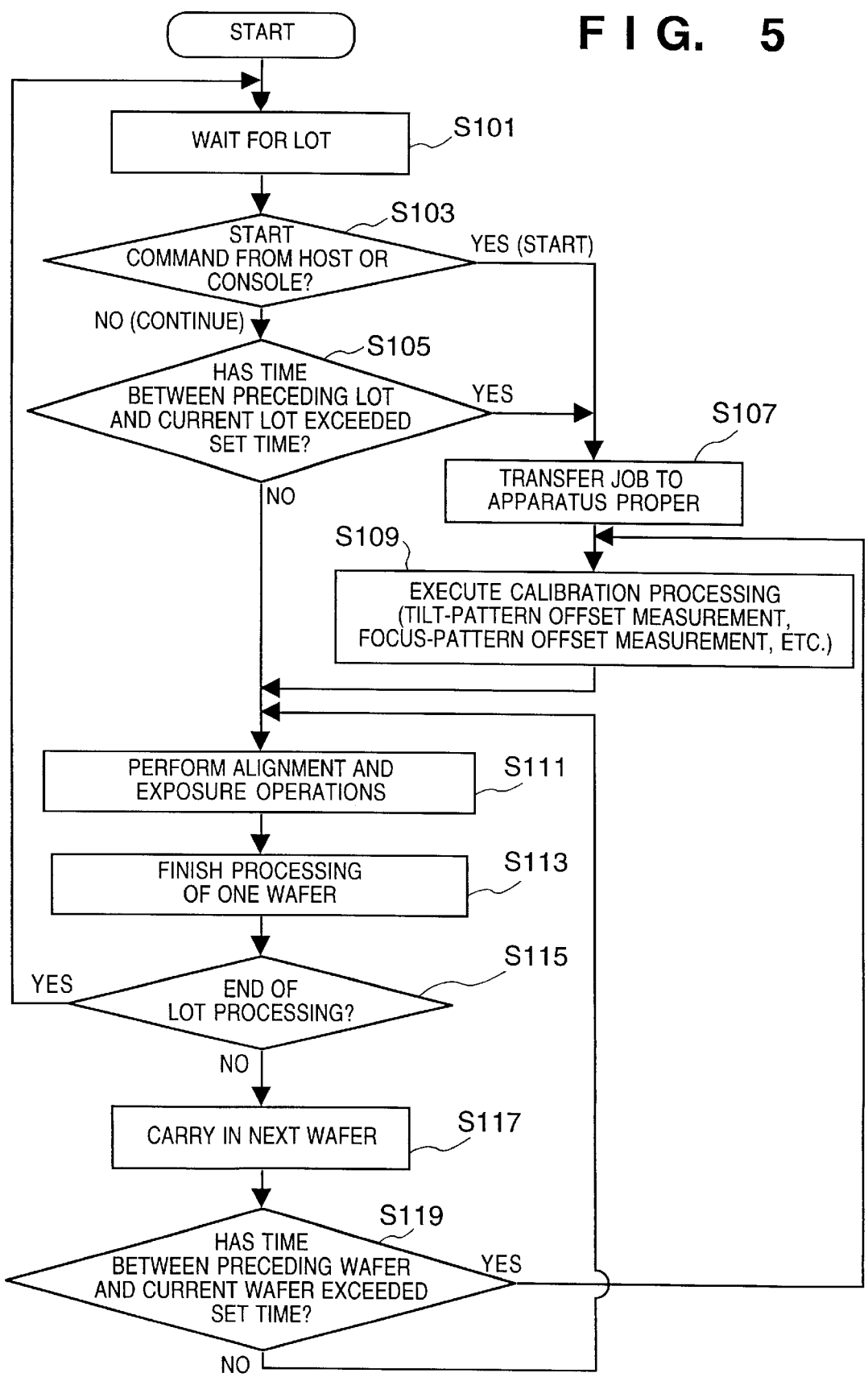
FIG. 5 is a flowchart showing an operation for bypassing job re-transfer and calibration processing in the apparatus of FIG. 1.

Next, reference will be had to FIG. 5 to describe the operation of the apparatus shown in FIG. 1, namely an embodiment which includes job re-transfer and calibration processing in accordance with the present invention. FIG. 5 illustrates the sequence flow of the content of lot processing in the exposure apparatus of FIG. 1. If the operator starts lot processing by pressing a START button (not shown) or CONTINUE button (not shown) on the display (and touch panel) 102 under conditions in which the exposure apparatus is standing by for a lot (step S101) (a command for starting this lot processing may be issued as a START command or CONTINUE command from a host computer or personal computer), the exposure apparatus judges the content of the command from the host computer, personal computer or console unit 303 in FIG. 3 at step S103. Control proceeds to step S107 if the command is a START command and to step S105 if the command is a CONTINUE command.

It is determined at step S105 whether the time from the end of processing of the preceding lot to the receipt of the current command is greater than the time set as "Calibration Time" shown in FIG. 4. If it is determined that the set time has been exceeded, then it is necessary to perform calibration and, hence, control proceeds to step S107. If it is determined that the set time has not been exceeded, then control proceeds to step S111.

The job is transferred to the main-unit CPU 321 of FIG. 3 at step S107. Next, calibration processing is executed at step S109. This involves measuring tilt-pattern offset and focus-pattern offset. Control then proceeds to step S111, where alignment and exposure operations are carried out. When operation for exposing one wafer is thus completed (step S113), it is 10 determined at step S115 whether the processed wafer is the final wafer of the lot. If the processed wafer is the final wafer (indicating end of lot processing), then control returns to step S101 and the exposure apparatus waits for the next lot.

If it is determined at step S115 that the processing wafer is not the final wafer of the lot, control proceeds to step S117, where the apparatus waits for the next wafer to be carried in. When the next wafer is carried in, it is determined at step S119 whether the time from the end of exposure of the preceding wafer to the introduction of the current wafer has exceeded the time set as "Calibration Time" shown in FIG. 4. If it is determined that the set time has been exceeded, then it is necessary to perform calibration and, hence, control proceeds to step S109. If it is determined that the set time has not been exceeded, then control returns to step S111, where the alignment and exposure operations are carried out. Thus, repetitive exposure processing is executed until it is determined at step S115 that the processed wafer is the last wafer of the lot.

Thus, in a case where it is found at step S103 that the command from the host computer or the like is the CONTINUE command, i.e., that the job and reticle used are the same as those of the preceding lot, and if the time from the end of processing of the preceding lot to the start of processing of the current lot does not exceed the set time, steps S107 and S109 are bypassed and, hence, job transfer and calibration processing are not executed. As a result, the time from transition of processing of the preceding lot to processing of the current lot can be shortened.

Figure 6:
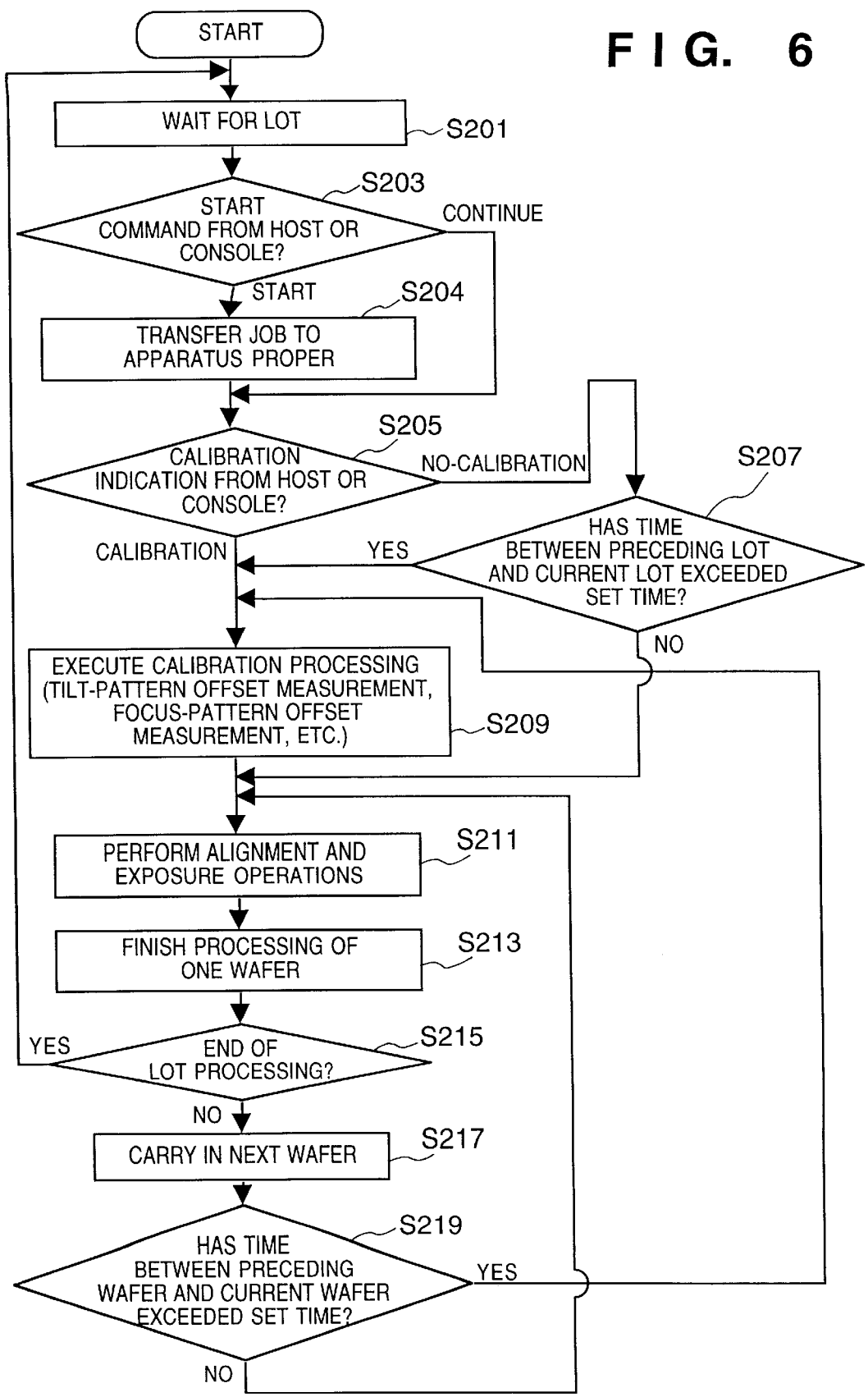
FIG. 6 is a flowchart illustrating the operation of a semiconductor exposure apparatus according to another embodiment of the present invention.

FIG. 6 is a flowchart showing the operation of a semiconductor exposure apparatus according to another embodiment of the present invention. The construction of the apparatus is the same as that shown in FIGS. 1 to 3. In this embodiment, the operator starts lot processing by pressing the START button (not shown) or CONTINUE button (not shown) on the display (and touch panel) 102 under conditions in which the exposure apparatus is standing by for a lot (step S201), and applies a "Calibration" or "No Calibration" indication as additional information. The command or indication for starting lot processing may be issued from a host computer or personal computer. When the command is received, the exposure apparatus judges the content of the command at step S203. If the command is the START command, the job is transferred to the main-unit CPU 321 of FIG. 3 at step S204, after which control proceeds to step S205. If the command is the CONTINUE command, step S204 is bypassed and control proceeds to step S205.

The content of the indication serving as the above-mentioned additional information is judged at step S205. Control proceeds to step S209 if the indication is "Calibration" and to step S207 if the indication is "No Calibration". It is determined at step S207 whether the time from the end of processing of the preceding lot to the receipt of the current command is greater than the time set as "Calibration Time" shown in FIG. 4. If it is determined that the set time has been exceeded, then it is necessary to perform calibration and, hence, control proceeds to step S209. If it is determined that the set time has not been exceeded, then control proceeds to step S211. Calibration processing such as measurement of tilt-pattern offset and focus-pattern offset is executed at step S209, after which control proceeds to step S211.

Repetitive exposure processing is executed from step S211 onward until the last wafer of the lot is reached, in a manner similar to that of FIG. 5.

Thus, in a case where it is found at step S203 that the command from the host computer or the like is the CONTINUE command, i.e., that the job and reticle used are the same as those of the preceding lot, transfer of the job at step S204 is bypassed. Further, if the indication from the host computer or the like is "No Calibration" and the time from the end of processing of the preceding lot to the start of processing of the current lot does not exceed the set time, then step S209 is bypassed and calibration processing is not executed. As a result, when the transition from processing of the preceding lot to processing of the current lot is made, no wasted time is expended.

<Embodiment of Device Manufacturing Method>

An embodiment of a method of manufacturing a device utilizing the above-described exposure apparatus will now be set forth.

Figure 7:
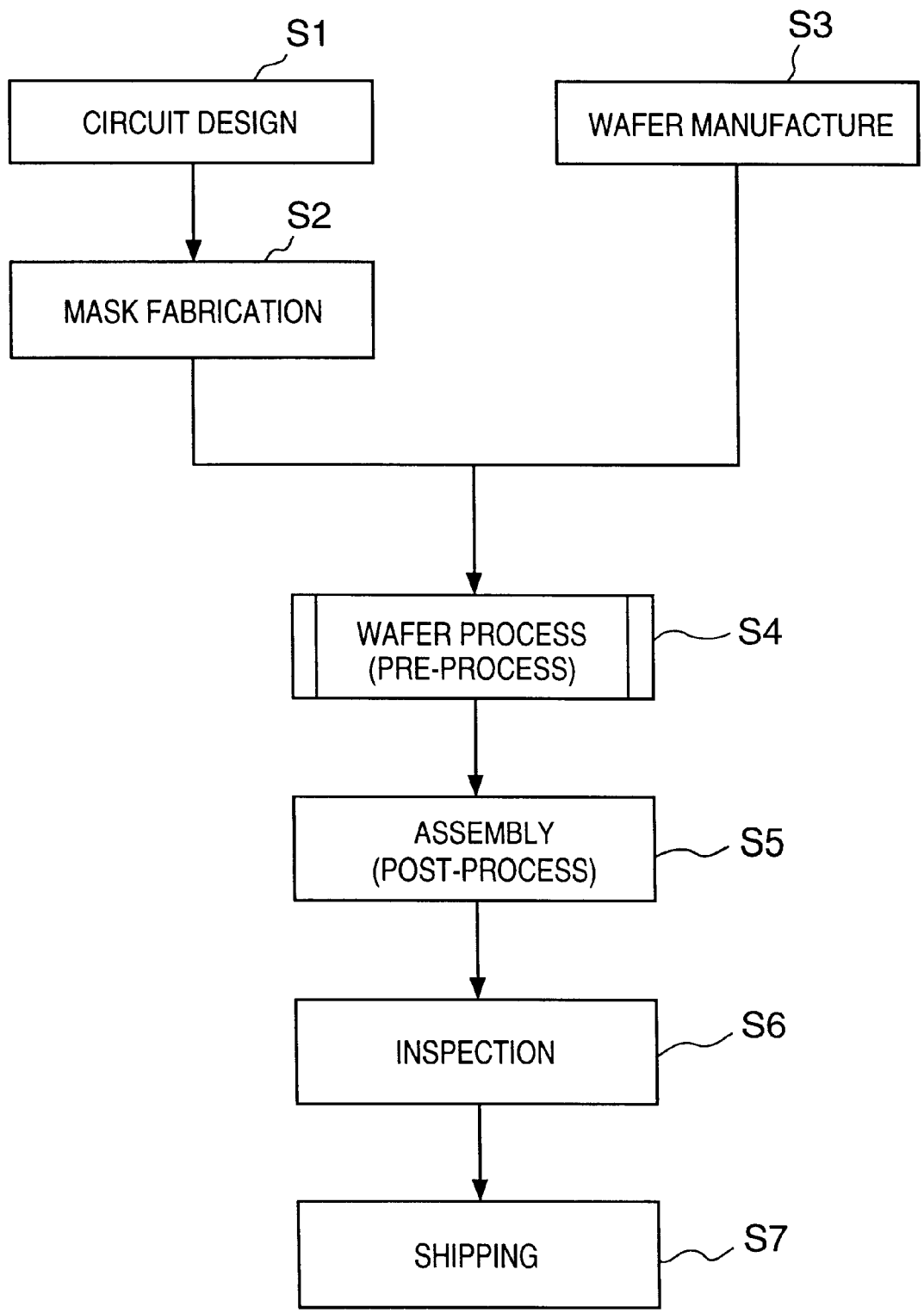
FIG. 7 is a flowchart illustrating a device manufacturing method capable of utilizing the exposure apparatus of the present invention.

FIG. 7 is a diagram showing the flow of manufacture of a microdevice (a semiconductor chip such as an IC or LSI chip, a liquid crystal panel, a CCD, a thin-film magnetic head, a micromachine, etc.). The pattern for the device is designed at step S1 (circuit design). A mask on which the designed circuit pattern has been formed is fabricated at step S2 (mask fabrication). Meanwhile, a wafer is manufactured using a material such as silicon or glass at step S3 (wafer manufacture). The actual circuit is formed on the wafer by lithography, using the mask and wafer that have been prepared, at step S4 (wafer process), which is also referred to as a "pre-process". A semiconductor chip is obtained, using the wafer fabricated at step S4, at step S5 (assembly), which is also referred to as a "post-process". This step includes steps such as actual assembly (dicing and bonding) and packaging (chip encapsulation). The semiconductor device fabricated at step S5 is subjected to inspections such as an operation verification test and durability test at step S6

(inspection). The semiconductor device is completed through these steps and then is shipped (step S7).

Figure 8:
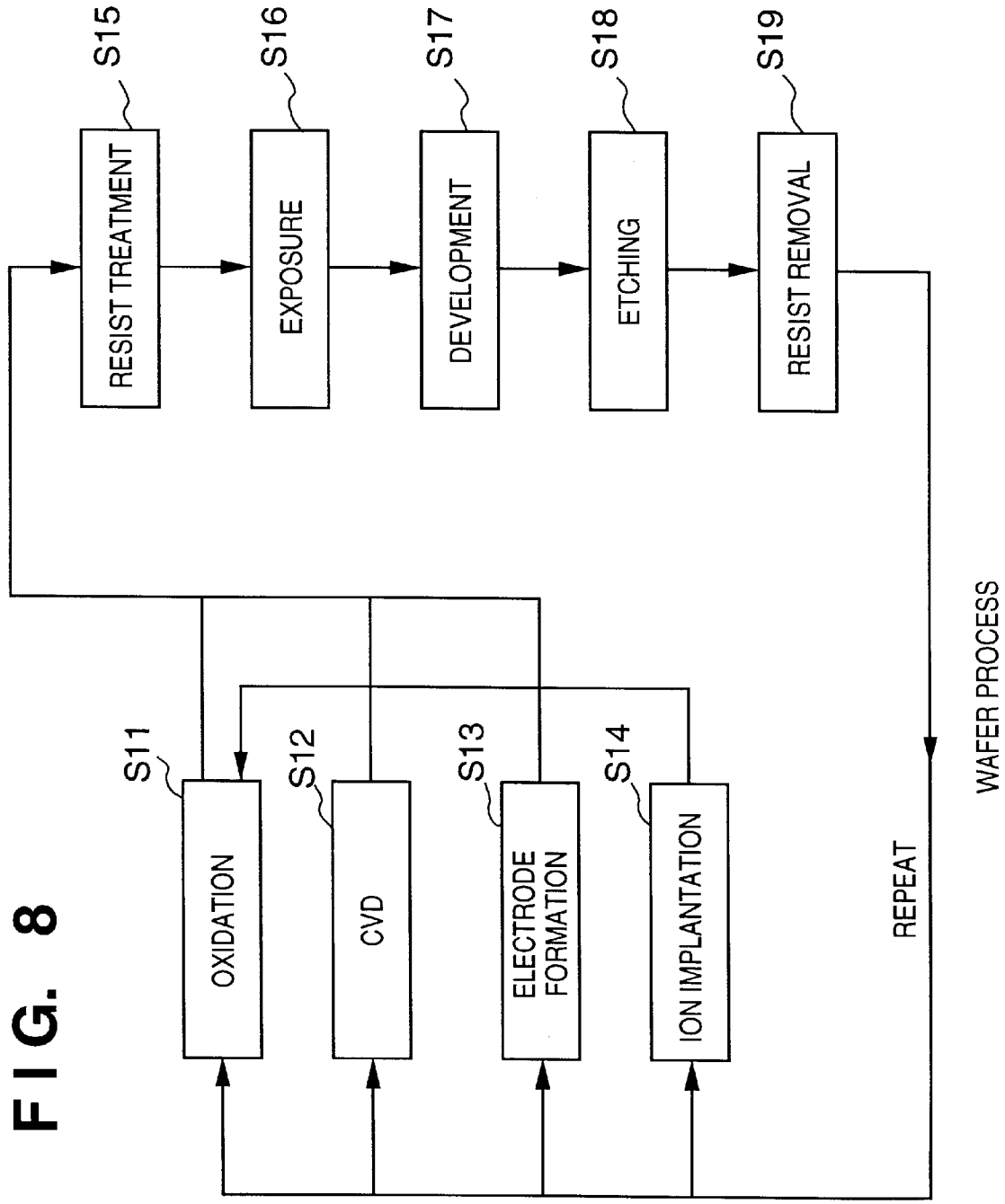
FIG. 8 is a flowchart illustrating the detailed flow of a wafer process.
Figure 2:
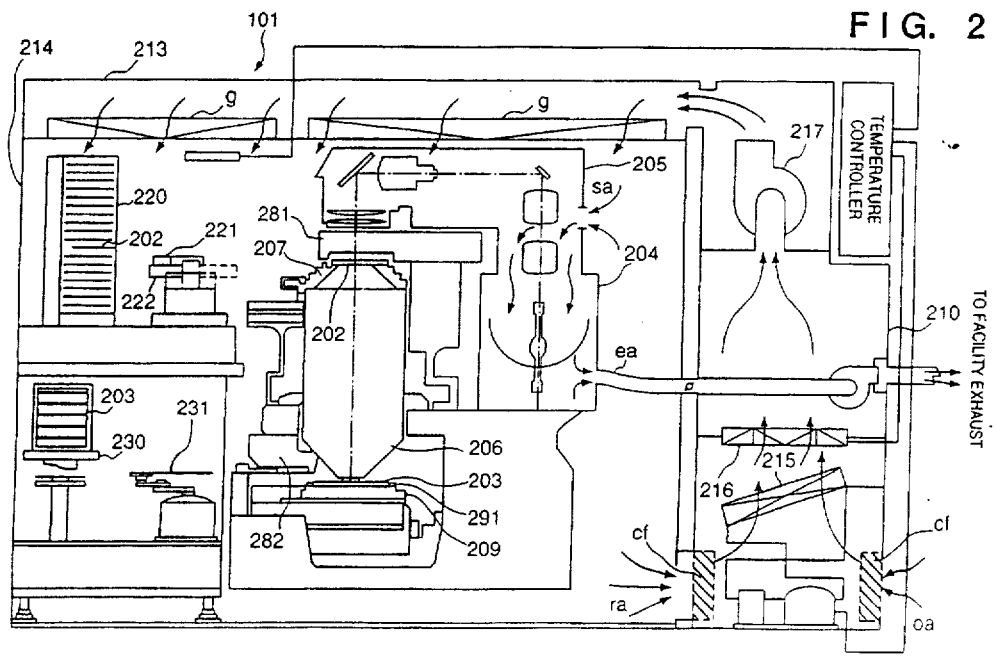

FIG. 8 is a flowchart illustrating the detailed flow of the wafer process mentioned above. The surface of the wafer is oxidized at step S11 (oxidation). An insulating film is formed on the wafer surface at step S12 (CVD), electrodes are formed on the wafer by vapor deposition at step S13 (electrode formation), and ions are implanted in the wafer at step S14 (ion implantation). The wafer is coated with a photoresist at step S15 (resist treatment), the wafer is exposed to the circuit pattern of the mask to print the pattern onto the wafer by the above-described projection exposure apparatus at step S16 (exposure), and the exposed wafer is developed at step S17 (development). Portions other than the developed photoresist are etched away at step S18 (etching), and unnecessary resist left after etching is performed is removed at step S19 (resist removal). Multiple circuit patterns are formed on the wafer by implementing these steps repeatedly.

If the production process of this embodiment is employed, large devices can be manufactured at low cost. Manufacture of such devices using the prior-art techniques was difficult.

Thus, in accordance with the present invention, as described above, re-transfer of a job and/or calibration is bypassed in a case where the processing of lots using the same job and the same reticle is executed in succession. This makes it possible to shorten the time required for processing to make the transition from one lot to the next and to raise the real availability of the exposure apparatus.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for executing predetermined calibration processing and exposing a substrate to a pattern on a reticle in accordance with a job representing exposure parameters for one lot, the job transferred to the apparatus, said apparatus comprising:

determination means for determining whether a job and a reticle used to expose a current lot are the same as a job and a reticle used to expose a preceding lot; and bypass means for bypassing re-transfer of a job to the apparatus and/or the calibration processing when said determination means determines that the job and the reticle used to expose the current lot and the job and the reticle used to expose the preceding lot are the same.

2. The apparatus according to claim 1, wherein when time from the end of exposure of a preceding lot to the start of the exposure of a current lot exceeds a predetermined time interval, the calibration processing is executed before the exposure of the current lot is performed, even if the job and the reticle used to expose the preceding lot are the same as the job and the reticle used to expose the current lot.

3. The apparatus according to claim 1, wherein the calibration processing includes tilt-pattern offset measurement and focus-pattern offset measurement; and when the calibration processing is executed before the exposure of the current lot, said calibration processing is executed using a first substrate of the current lot.

4. The apparatus according to claim 1, wherein a decision as to whether to bypass re-transfer of a job is made according to an indication from a console of the apparatus, a host computer or a personal computer.

5. A method for manufacturing a device by exposing a substrate to a pattern on a reticle using an exposure apparatus apparatus for executing predetermined calibration processing and exposing a substrate to a pattern on a reticle in accordance with a job representing exposure parameters for one lot, the job transferred to the apparatus, comprising the steps of:

providing a determination means for determining whether a job and a reticle used to expose a current lot are the same as a job and a reticle used to expose a preceding lot; and providing a bypass means for bypassing re-transfer of a job to the apparatus and/or calibration processing when said determination means determines that a job and a reticle used to expose the current lot and a job and a reticle used to expose the preceding lot are the same, wherein exposure of the current lot is performed upon the bypass means bypassing the re-transfer of a job to the apparatus and/or the calibration processing.

6. A method of controlling an exposure apparatus for executing predetermined calibration processing and exposing a substrate to a pattern on a reticle in accordance with a job representing exposure parameters for one lot, the job transferred to the apparatus, comprising:

a determination step of determining whether a job and a reticle used to expose a current lot are the same as a job and a reticle used to expose a preceding lot; and a bypass step of bypassing re-transfer of a job to the apparatus and/or the calibration processing when said determination step determines that the job and the reticle used to expose the current lot and the job and the reticle used to expose the preceding lot are the same.

7. The method according to claim 6, wherein when time from end of exposure of a preceding lot to the start of exposure of a current lot exceeds a predetermined time interval, the calibration processing is executed before exposure of the current lot is performed, even if the job and the reticle used to expose the preceding lot are the same as the job and the reticle used to expose the current lot.

8. The method according to claim 6, wherein the calibration processing includes tilt-pattern offset measurement and focus-pattern offset measurement; and when the calibration processing is executed before exposure of the current lot is performed, said calibration processing is executed using a first substrate of the current lot.

9. The method according to claim 6, wherein a decision as to whether to bypass re-transfer of a job and/or the calibration processing is made according to an indication from a console of the apparatus, a host computer or a personal computer.

* * * * *

UNITED STATES PATENT AND TRADEMARK OFFICE
CERTIFICATE OF CORRECTION

PATENT NO. : 6,320,646 B1
DATED : November 20, 2001
INVENTOR(S) : Takashi Mouri

It is certified that error appears in the above-identified patent and that said Letters Patent is hereby corrected as shown below:

<u>Drawings</u>,
Sheet 2, Fig. 2 should be replaced with the amended Fig. 2 on attached page.

<u>Column 2</u>,
Line 59, "lot" should read -- lot or substrate --.

<u>Column 8</u>,
Line 9, "apparatus" should be deleted.

Signed and Sealed this

Twenty-third Day of April, 2002

*Attest:*

*Attesting Officer*

JAMES E. ROGAN
*Director of the United States Patent and Trademark Office*